United States Patent
Wong

(12) United States Patent Wong
(10) Patent No.: US 6,649,425 B2
(45) Date of Patent: Nov. 18, 2003

(54) METHOD TO REDUCE LEAKAGE DURING A SEMI-CONDUCTOR BURN-IN PROCEDURE

(75) Inventor: Ban P. Wong, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/825,977

(22) Filed: Apr. 4, 2001

(65) Prior Publication Data

US 2002/0146852 A1 Oct. 10, 2002

(51) Int. Cl.⁷ .............................................. H01L 21/66
(52) U.S. Cl. ............................................ 438/14; 438/15
(58) Field of Search .......................... 438/15, 613, 14, 438/18, 17, 910, 5, 10, 11; 365/189.09, 201, 27, 185.18, 185.24, 185.27; 327/535, 537

(56) References Cited

U.S. PATENT DOCUMENTS

| | | | | |
|---|---|---|---|---|
| 4,647,956 A | | 3/1987 | Shrivastava et al. | 357/42 |
| 4,899,312 A | * | 2/1990 | Sato | 365/230.09 |
| 5,949,726 A | * | 9/1999 | Tseng et al. | 365/201 |
| 5,981,322 A | * | 11/1999 | Keeth et al. | 438/199 |
| 5,999,011 A | | 12/1999 | Chu et al. | 324/769 |
| 6,172,554 B1 | * | 1/2001 | Young et al. | 327/535 |
| 6,195,305 B1 | * | 2/2001 | Fujisawa et al. | 365/226 |

OTHER PUBLICATIONS

PCT International Search Report dated Oct. 15, 2002, 3 pages.

* cited by examiner

Primary Examiner—Amir Zarabian
Assistant Examiner—Pamela Perkins
(74) Attorney, Agent, or Firm—Rosenthal & Osha L.L.P.

(57) ABSTRACT

A method for reducing sub-threshold leakage during the burn-in procedure for a semi-conductor is disclosed. The method includes applying a back-bias voltage to the device during the burn-in procedure. The back-bias voltage increases the threshold voltage of the semi-conductor device and consequently, reduces the sub-threshold leakage current.

9 Claims, 3 Drawing Sheets

METHOD TO REDUCE LEAKAGE DURING A SEMI-CONDUCTOR BURN-IN PROCEDURE

BACKGROUND OF INVENTION

When semi-conductor circuits are fabricated to manufacture such items as a computer microprocessor or other microelectronics, a certain number of failures from the total production run is expected. Typically, these failures come early or late in the life of the circuit. FIG. 1 shows a graph 10 of the number of expected failures over a period of time. The curve is commonly referred to as a "bathtub curve". It shows three distinct regions: the "infant stage" 12, the "operational life stage" 14; and the "old age stage" 16. During the infant stage 12, the number of failures maybe high and they decrease in number rapidly as the curve moves in the operational life stage 14. While in the operational stage 14, the number of failures falls to practically zero until the curve moves in the old age stage 16. Once in the old age stage 16, the number of failures begins the increase rapidly as the product's effective life expires.

A goal of manufacturers is to get a product over the infant stage 12 quickly in order to weed out defects prior to shipment to the customer. In the case of semi-conductor circuits, this goal is accomplished by a procedure called "burn-in". The procedure includes subjecting the circuit to stresses such as elevated temperatures and supply voltages as a technique of accelerating the operational life. For example, some semi-conductors have an infant stage that could last as long as 3–4 years of normal operation, while the operational life may last as long as 10 years. Obviously in such a case, a successful burn-in procedure must accelerate the time frame of the bathtub curve. As a result, a standard burn-in process can last about 36–48 hours. The net result is 48 hours in a burn-in procedure can simulate four years of normal operation and thereby greatly increase product reliability for the customer.

FIG. 2 shows a cross-sectional view of a prior art N-type metal oxide semi-conductor field effect transistor (N-type MOSFET). This type of transistor is devices. The transistor includes a gate 26 region, a source 28 region, and a drain 30 region. These regions are located in an architectural layer 32 of P-type material. This P layer 32 further overlays a conductive substrate 34 of doped P+ type material. This P+ substrate 34 is connected to the source voltage (Vss) 38 for the circuit. The source 28, the gate 26, and the drain 30 are each provided with a separate metallic lead 22a, 22b, 22c respectively. Each lead 22a, 22b, 22c is connected to its respective region 28, 26, 30 through a conductive contact 24a, 24b, 24c. Finally, the source 28 and drain 30 are isolated from other elements of the circuit by respective field oxide regions 36a, 36b. These regions 36a, 36b are made of a non-conductive material which prevents the transfer of any transient currents outside the transistor 20.

During normal operation, a positive voltage is applied to the gate 26 from its metallic lead 22b. This effectively turns the transistor 20 "on" and current flows through the device. In order to turn the transistor on, the voltage applied to the gate 26 must be sufficient to overcome the threshold voltage (Vt) that is an inherent characteristic of the device. As the name implies, the threshold voltage is the point where the device switches from the "off" state to the "on" state and vice-versa. Another characteristic of the device is the leakage or standby current. This is the current that normally flows through the device when it is in the "off" state. The threshold voltage and the leakage current have an exponential relationship.

In current circuit design trends, the threshold voltage of semi-conductor devices is being reduced as much as possible to increase the speed of the circuit. While this technique is successful in achieving performance gains, it causes difficulties during the burn-in procedure when the temperatures are increased and the supply voltage may be increased as much as 50% above normal levels. The stresses of burn-in have the effect of increasing the leakage current to unacceptable levels. The solution has been to back off on performance improvements by raising the threshold voltages in order to hold leakage current to acceptable levels during the burn-in procedure.

SUMMARY OF INVENTION

In some aspects the invention relates to a method for conducting a burn-in procedure for a semi-conductor device comprising: applying a burn-in procedure stress to the semi-conductor device; and applying a negative back-bias voltage to the semi-conductor device.

In an alternative embodiment, the invention relates to a method for conducting a burn-in procedure for a semi-conductor device comprising: step for applying a burn-in procedure stress to the semi-conductor device; and step for applying a negative back-bias voltage to the semi-conductor device.

Advantages of the invention may include, one or more of the following. There is no reduction in performance characteristics of semi-conductors due to leakage current constraints during the burn-in procedure. No alterations of existing statistical reliability baselines are necessary due to modifications in burn-in procedures to accommodate leakage current constraints.

DETAILED DESCRIPTION

Figure 1:
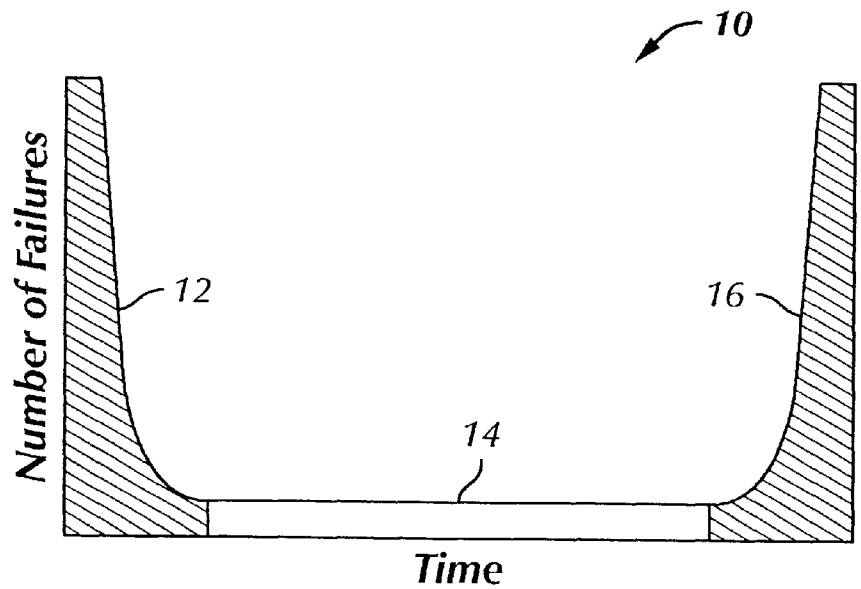
FIG. 1 shows a graph of expected failures of semi-conductor components over time.

Exemplary embodiments of the invention will be described with reference to the accompanying drawings. Like items in the drawings are shown with the same reference numbers.

Figure 2:
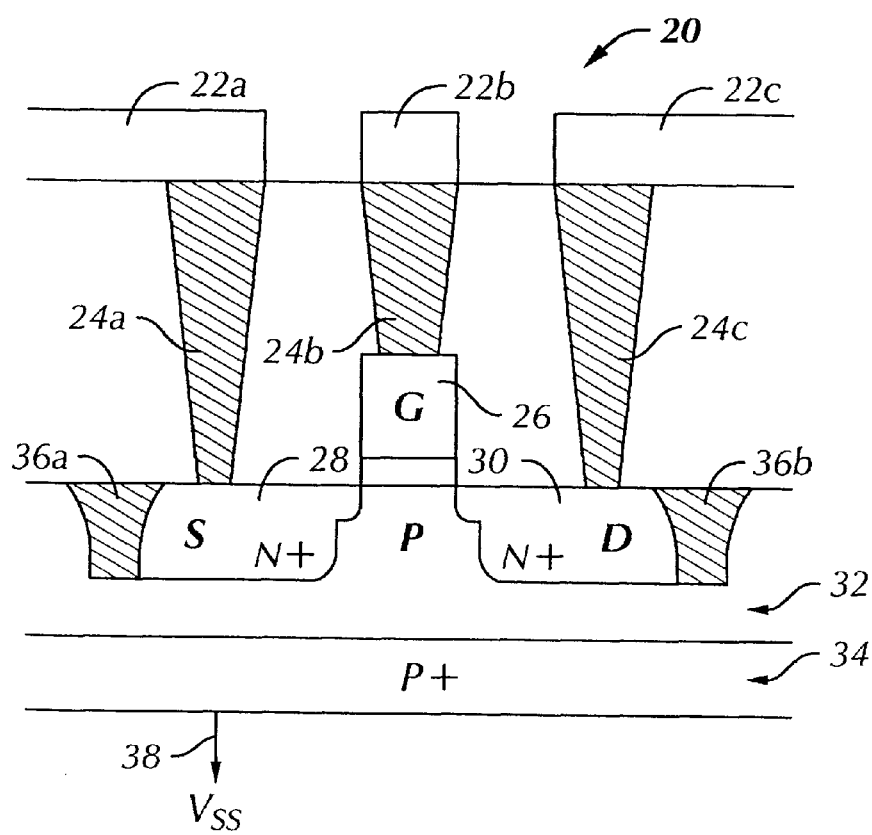
FIG. 2 shows a prior art cross section of an N-type transistor.
Figure 3:
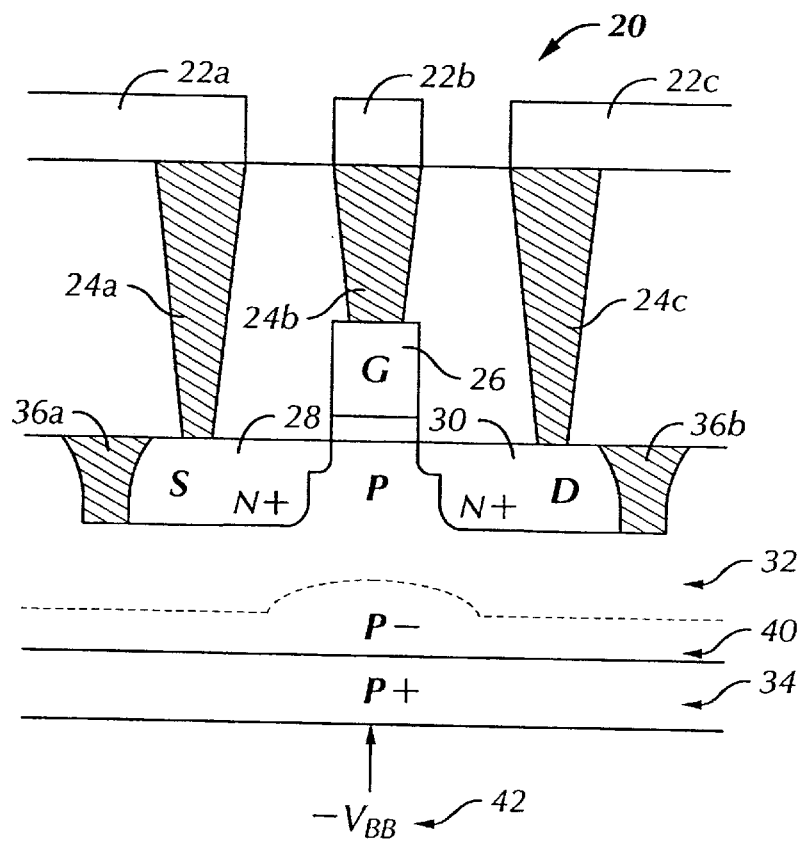
FIG. 3 shows one embodiment of a cross section of an N-type transistor in accordance with the present invention.

FIG. 3 shows one embodiment of a cross-sectional view of an N-type MOSFET transistor in accordance with the present invention. As can be seen, the physical arrangement of the transistor 20 is the same as shown in FIG. 2. The difference is that a negative "back-bias" voltage (−Vbb) 42 is applied to the P+ conductive substrate 34. When the back-bias voltage 42 is applied, it has the effect of creating a depletion region 40 within the layer of P-type material 32. The depletion region 40 is formed in the section of the P layer 32 that is immediately adjacent to the P+ substrate 34.

Figure 4:
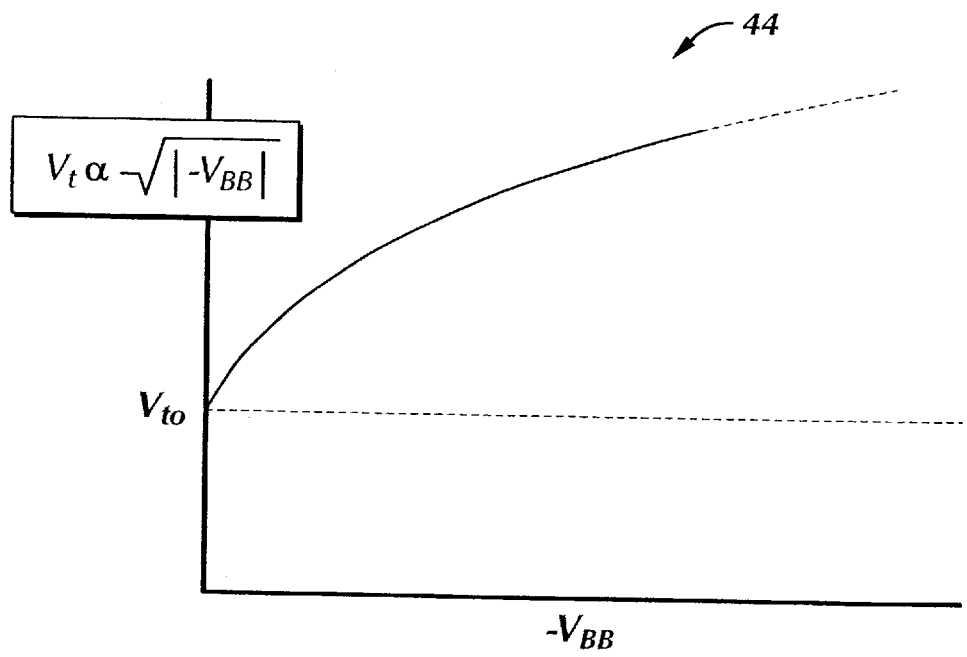
FIG. 4 shows a graph of the relationship between the threshold voltage and the back-bias voltage.

The addition of the back-bias voltage 42 raises the value of the threshold voltage (Vt) of the transistor by neutralizing a portion the positive voltage applied on the gate 26. The net result is a reduction in the leakage current due to the increased threshold voltage. The relationship between the threshold voltage (Vt) and the back-bias voltage (−Vbb) is shown in FIG. 4. The baseline threshold voltage (Vto) represents the threshold voltage value before the application of the back-bias voltage. The graph 44 shows the curve of the increased threshold voltage (Vt) is proportional to the square root of the absolute value of Vbb. As shown, a small initial increase in −Vbb will result in a significant increase in Vt.

In some embodiments, a back-bias voltage of as little as 0.5 volts will result in an order of magnitude (10×) improvement in the threshold voltage. During a burn-in procedure, the addition of 0.5–1.0 volts is not a significant increase in stress on the circuit when it is added to the source voltage (Vss) with its 50% increase from its normal value. Consequently, when back-biasing as shown in FIG. 3 is applied during a burn-in procedure, the threshold voltage can be raised and leakage current can be reduced without sacrificing performance for the sake of the burn-in.

Figure 5:
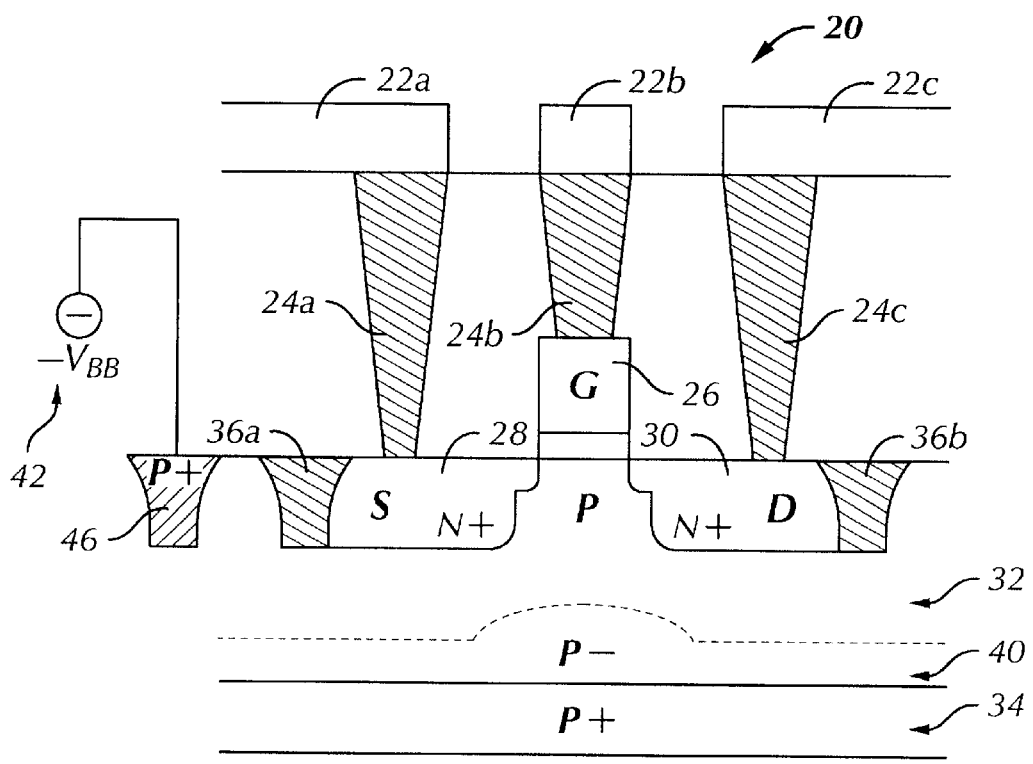
FIG. 5 shows an alternative embodiment of a cross section of an N-type transistor in accordance with the present invention.

An alternative embodiment of the present invention is shown in FIG. 5. In this embodiment, the arrangement of the components of the transistor 20 is the same as shown in FIG. 3 and FIG. 4, with the exception of the point of application of the negative back-bias voltage 42. This embodiment shows the back-bias voltage 42 being applied to a plug of P+ type material 46 that is located in a channel within the layer of P material 32. The effect of the back-biasing is same as shown in FIG. 3. The only difference is the location of the application point of −Vbb 42.

Although only two exemplary embodiments of back-biasing have been disclosed, it is intended that this invention would be able to make use of any suitable alternative methods of back-biasing in order to diminish current leakage during a burn-in procedure. Additionally, while embodiments are shown using an N-type MOSFET, the invention could be used on other types of transistors such as P-type MOSFETs.

Advantages of the invention may include, one or more of the following. There is no reduction in performance characteristics of semi-conductors due to leakage current constraints during the burn-in procedure. No alterations of existing statistical reliability baselines are necessary due to modifications in burn-in procedures to accommodate leakage current constraints.

While the invention has been disclosed with reference to specific examples of embodiments, numerous variations and modifications are possible. Therefore, it is intended that the invention not be limited by the description in the specification, but rather the claims that follow.

What is claimed is:

1. A method for reducing a leakage current during a burn-in procedure for a microprocessor comprising:

conducting the burn-in procedure, wherein the conducting comprises:
applying a negative back-bias voltage during the burn-in procedure to a substrate of the microprocessor, wherein the substrate is grounded prior to applying the negative back-bias voltage; and
applying a burn-in stress to the microprocessor.

2. The method of claim 1, wherein the negative back-bias voltage has a value between 0 volts and −1.0 volts.

3. The method of claim 1, wherein the negative back-bias voltage has a value of −1.0 volts.

4. The method of claim 1, wherein the negative back-bias voltage is applied to a conductive substrate of the microprocessor.

5. The method of claim 1, wherein the negative back-bias voltage is applied to a conductive plug of the microprocessor.

6. The method of claim 1, wherein the microprocessor comprises a transistor.

7. The method of claim 6, wherein the transistor is a metal oxide semi-conductor field-effect transistor.

8. The method of claim 7, wherein the metal oxide semi-conductor field-effect transistor is an N-type metal oxide semi-conductor field-effect transistor.

9. A method for reducing a leakage current during a burn-in procedure for a microprocessor comprising:

step for conducting the burn-in procedure, wherein the conducting comprises:
step for applying a burn-in procedure stress to the microprocessor; and
step for applying a negative back-bias voltage during the burn-in procedure to a substrate of the microprocessor, wherein the substrate is grounded prior to applying the negative back-bias voltage.

* * * * *